United States Patent
Hofmann (10) Patent No.: US 8,803,027 B2
(45) Date of Patent: Aug. 12, 2014

(54) DEVICE AND METHOD TO CREATE A LOW DIVERGENCE, HIGH POWER LASER BEAM FOR MATERIAL PROCESSING APPLICATIONS

(75) Inventor: Thomas Hofmann, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 1125 days.

(21) Appl. No.: 11/805,596

(22) Filed: May 23, 2007

(65) Prior Publication Data
US 2007/0280311 A1    Dec. 6, 2007

Related U.S. Application Data

(63) Continuation-in-part of application No. 11/447,379, filed on Jun. 5, 2006.

(51) Int. Cl.
*B23K 26/00* (2014.01)

(52) U.S. Cl.
USPC ............ 219/121.65; 219/121.83; 372/55; 372/57; 372/61; 372/26; 372/38.01; 372/38.02; 372/62; 372/9; 372/25; 372/29.01; 372/109; 372/95; 372/96; 372/97; 359/333; 359/337; 359/342; 359/349

(58) Field of Classification Search
CPC .... C30B 13/24; C30B 29/06; B23K 26/0738; B23K 26/063; H01L 21/67115
USPC ......... 219/121.65, 121.83; 372/61, 26, 38.01, 372/38.02, 62, 9, 25, 29.02, 30, 33, 34, 372/55–59, 81, 95–97, 109; 359/333, 337, 359/342, 349
See application file for complete search history.

(56) References Cited

U.S. PATENT DOCUMENTS

| | | | | |
|---|---|---|---|---|
| 3,924,201 A | * | 12/1975 | Crow | 372/108 |
| 4,551,684 A | | 11/1985 | Bernhardt | |
| 4,559,627 A | * | 12/1985 | Chun | 372/92 |
| 5,179,563 A | * | 1/1993 | Palma et al. | 372/27 |
| 5,179,564 A | | 1/1993 | Benda et al. | |
| 5,383,199 A | * | 1/1995 | Laudenslager et al. | 372/25 |

(Continued)

FOREIGN PATENT DOCUMENTS

| | | | | |
|---|---|---|---|---|
| DE | 19606555 | * | 8/1997 | H01S 3/06 |
| JP | 03203279 | | 9/1991 | |

(Continued)

OTHER PUBLICATIONS

Kakehata et al. "Output characteristics of a discharge-pumped F2 laser (167 nm) with an injection-seeded unstable resonator" J. Appl. Phys. 74 (4), Aug. 15, 1993.*

(Continued)

*Primary Examiner* — Dana Ross
*Assistant Examiner* — Brett Spurlock
(74) *Attorney, Agent, or Firm* — Procopio, Cory, Hargreaves & Savitch, LLP; Noel C. Gillespie (57) ABSTRACT

A thin beam laser crystallization apparatus for selectively melting a film deposited on a substrate is disclosed having a laser source producing a pulsed laser output beam, the source having an oscillator comprising a convex reflector and a piano output coupler; and an optical arrangement focusing the beam in a first axis and spatially expanding the beam in a second axis to produce a line beam for interaction with the film.

6 Claims, 6 Drawing Sheets

(56) References Cited

U.S. PATENT DOCUMENTS

| | | | |
|---|---|---|---|
| 5,390,211 A * | 2/1995 | Clark et al. | 372/95 |
| 5,406,578 A * | 4/1995 | Gross et al. | 372/95 |
| 5,457,707 A * | 10/1995 | Sobey et al. | 372/20 |
| 5,557,630 A * | 9/1996 | Scaggs | 372/95 |
| 5,602,864 A * | 2/1997 | Welch et al. | 372/50.11 |
| 5,661,748 A * | 8/1997 | Zahavi et al. | 372/108 |
| 5,684,822 A * | 11/1997 | Partlo | 372/95 |
| 5,808,178 A * | 9/1998 | Rounbehler et al. | 73/23.39 |
| 5,946,337 A | 8/1999 | Govorkov et al. | 372/92 |
| 6,021,150 A * | 2/2000 | Partlo et al. | 372/57 |
| 6,034,977 A * | 3/2000 | St. Pierre | 372/34 |
| 6,067,311 A * | 5/2000 | Morton et al. | 372/57 |
| 6,212,211 B1 * | 4/2001 | Azzola et al. | 372/33 |
| 6,314,119 B1 | 11/2001 | Morton | 372/57 |
| 6,317,447 B1 * | 11/2001 | Partlo et al. | 372/57 |
| 6,381,257 B1 * | 4/2002 | Ershov et al. | 372/57 |
| 6,437,824 B1 | 8/2002 | Suzuki et al. | |
| 6,535,531 B1 * | 3/2003 | Smith et al. | 372/25 |
| 6,538,737 B2 * | 3/2003 | Sandstrom et al. | 356/333 |
| 6,549,551 B2 * | 4/2003 | Partlo et al. | 372/38.07 |
| 6,567,450 B2 * | 5/2003 | Myers et al. | 372/55 |
| 6,625,191 B2 * | 9/2003 | Knowles et al. | 372/55 |
| 6,690,704 B2 * | 2/2004 | Fallon et al. | 372/58 |
| 6,704,340 B2 * | 3/2004 | Ershov et al. | 372/58 |
| 6,738,408 B2 * | 5/2004 | Abedin | 372/94 |
| 6,801,560 B2 * | 10/2004 | Knowles et al. | 372/55 |
| 6,868,106 B1 | 3/2005 | Vogler | |
| 6,928,093 B2 * | 8/2005 | Webb et al. | 372/25 |
| 6,985,508 B2 * | 1/2006 | Knowles et al. | 372/55 |
| 7,009,140 B2 | 3/2006 | Partlo et al. | 219/121.65 |
| 7,039,086 B2 * | 5/2006 | Fallon et al. | 372/55 |
| 7,058,107 B2 * | 6/2006 | Knowles et al. | 372/55 |
| 7,061,959 B2 | 6/2006 | Partlo et al. | 372/55 |
| 7,167,499 B2 | 1/2007 | Das et al. | 372/55 |
| 7,203,216 B2 * | 4/2007 | Ershov et al. | 372/55 |
| 7,433,372 B2 | 10/2008 | Hofmann | |
| 7,471,455 B2 | 12/2008 | Das et al. | |
| 7,564,888 B2 | 7/2009 | Ershov et al. | |
| 8,265,109 B2 * | 9/2012 | Das et al. | 372/25 |
| 2001/0009251 A1 | 7/2001 | Sekizawa et al. | |
| 2002/0101589 A1 * | 8/2002 | Sandstrom et al. | 356/334 |
| 2003/0099269 A1 * | 5/2003 | Ershov et al. | 372/55 |
| 2003/0120362 A1 | 6/2003 | Shchergrov | 700/37 |
| 2003/0224587 A1 * | 12/2003 | Yamazaki et al. | 438/487 |
| 2004/0022293 A1 * | 2/2004 | Rule et al. | 372/58 |
| 2004/0057489 A1 * | 3/2004 | Fallon et al. | 372/57 |
| 2004/0136417 A1 * | 7/2004 | Webb et al. | 372/25 |
| 2004/0182835 A1 | 9/2004 | Hall | |
| 2004/0182838 A1 * | 9/2004 | Das et al. | 219/121.76 |
| 2005/0035103 A1 * | 2/2005 | Partlo et al. | 219/121.73 |
| 2005/0141580 A1 * | 6/2005 | Partlo et al. | 372/55 |
| 2005/0221203 A1 | 10/2005 | Fujii | 430/5 |
| 2005/0259709 A1 | 11/2005 | Das et al. | 372/55 |
| 2005/0269300 A1 * | 12/2005 | Partlo et al. | 219/121.65 |
| 2005/0280887 A1 * | 12/2005 | Betin et al. | 359/333 |
| 2006/0001878 A1 | 1/2006 | Das et al. | 356/400 |
| 2006/0176913 A1 * | 8/2006 | Souhaite et al. | 372/10 |
| 2006/0209917 A1 * | 9/2006 | Fallon et al. | 372/55 |
| 2007/0097511 A1 | 5/2007 | Das et al. | 359/618 |
| 2007/0279747 A1 | 12/2007 | Hofmann | 359/583 |
| 2007/0280308 A1 | 12/2007 | Ershov et al. | 372/25 |

FOREIGN PATENT DOCUMENTS

| | | |
|---|---|---|
| JP | 06013682 | 1/1994 |
| JP | 08191166 | 7/1996 |
| JP | 09050961 | 2/1997 |
| JP | 2001007045 | 1/2001 |
| JP | 2001269789 | 10/2001 |
| WO | 2005054949 A2 | 6/2005 |

OTHER PUBLICATIONS

Baranov et al, Divergence of radiation from an electric-discharge XeCl laser operating in the pulse-periodic regime, 1988, Sov. J. Quantum Electron, 18 1065.*

Takenaka et al, High Power and High Focusing CW CO2 Laser Using an Unstable Resonator with a Phase-Unifying Output Coupler, Nov. 1991, IEEE Journal of Quantum Electronics , vol. 27, Issue: 11, 2482-2487.*

Siegman, "Lasers", *Univ. Sci. Books*, Mill Valley, Calif. 1986 publisher, Chapters 22 and 23.

European Patent Office, in Application No. 07815063.8, in Communication pursuant to Article 94(3) EPC, mailed Jan. 17, 2013, 4 pages.

Johannes, Mesa Pascasio, Patent Expert, Austrian Patent Office, in Singapore Patent Application No. 201104052-4, in Examiner's Search Report and Written Opinion, mailed Jan. 22, 2013, 11 pages.

English Translation of Japanese Office Action, in Japanese patent Application No. 2009-514316, mailed Jan. 22, 2013, 5 pages.

* cited by examiner

DEVICE AND METHOD TO CREATE A LOW DIVERGENCE, HIGH POWER LASER BEAM FOR MATERIAL PROCESSING APPLICATIONS

CROSS-REFERENCE TO RELATED APPLICATIONS

The present invention is a continuation-in-part of co-owned, U.S. patent application Ser. No. 11/447,379, titled, "DEVICE AND METHOD TO CREATE A LOW DIVERGENCE, HIGH POWER LASER BEAM FOR MATERIAL PROCESSING APPLICATIONS" filed on Jun. 5, 2006, published as US-2007/0278193-A1 on Dec. 26,2007, the contents of which are hereby incorporated by reference herein.

The present invention is also related to co-owned U.S. patent application Ser. No. 11/447,380, now U.S. Pat. No. 7,433,372, titled, "DEVICE AND METHOD TO STABILIZE BEAM SHAPE AND SYMMETRY FOR HIGH ENERGY PULSED LASER APPLICATIONS" by Hofmann, filed on Jun. 5, 2006, to co-owned U.S. Patent Application No. 60/811,242, titled, "HIGH POWER EXCIMER LASER WITH PULSE STRETCHER" to Hofmann et al., filed on Jun. 5, 2006, to U.S. application Ser. No. 11/261,948, titled "SYSTEMS AND METHOD FOR GENERATING A LASER SHAPED AS A LINE BEAM," filed on Oct. 28, 2005, to U.S. application Ser. No. 10/781,251, titled "VERY HIGH ENERGY, HIGH STABILITY GAS DISCHARGE LASER SURFACE TREATMENT SYSTEM," filed on Feb. 18, 2004, to U.S. application Ser. No. 10/884,101, titled "LASER THIN FILM POLY-SILICON ANNEALING OPTICAL SYSTEM," filed on Jul. 1, 2004, and to U.S. application Ser. No. 11/138,001, titled "SYSTEMS AND METHODS FOR IMPLEMENTING AN INTERACTION BETWEEN A LASER SHAPED AS A LINE BEAM AND A FILM DEPOSITED ON A SUBSTRATE" filed on May 26, 2005, the disclosures of each of which are hereby incorporated by reference herein.

FIELD OF THE INVENTION

The present invention relates to pulsed, gas discharge lasers. The present invention is particularly, but not exclusively useful as a high power laser beam having relatively low divergence along one axis.

BACKGROUND OF THE INVENTION

In many applications, it is desirable that the shape and/or symmetry of pulses within a high energy pulse train are stable from pulse-to-pulse. By way of example, but not limitation, one such application is the use of a high-energy, pulsed laser beam to melt an amorphous silicon film to induce crystallization of the film upon re-solidification, for the purpose of manufacturing thin film transistors (TFT's).

Many laser material processing applications prescribe the use of a high power laser beam having a beam shape, e.g., cross-section, that is dimensionally accurate. For example, laser crystallization of an amorphous silicon film that has been deposited on a substrate, e.g., glass, represents a promising technology for the production of material films having relatively high electron mobilities. More specifically, in one process, a high-energy, pulsed laser beam may be used to melt an amorphous silicon film to induce crystallization of the film upon re-solidification. Once crystallized, this material can then be used to manufacture (TFT's) and in one particular application, TFT's suitable for use in relatively large liquid crystal displays (LCD's). Other applications for crystallized silicon films may include Organic LED (OLED), System on a Panel (SOP), flexible electronics and photovoltaics. In more quantitative terms, high volume production systems may be commercially available in the near future capable of quickly crystallizing a film having a thickness of about 90 nm and a width of about 700 mm or longer.

Laser crystallization may be performed using pulsed laser light that is optically shaped to a line beam, e.g., laser light that is focused in a first axis, e.g., the short-axis, and expanded in a second axis, e.g., the long-axis. Typically, the first and second axes are mutually orthogonal and both axes are approximately orthogonal to a central ray traveling toward the film. An exemplary line beam for laser crystallization may have a beam width at the film of less than about 20 microns, e.g., 3-4 microns, and a beam length of about 700 mm, or larger. With this arrangement, the film can be scanned or stepped in a direction parallel to the beam width to sequentially melt and subsequently crystallize a film having a substantial length, e.g., 900 mm or more.

In one setup, the line beam may be shaped by passing the laser output through a field definition unit, which in the simplest case may be a slit shaped aperture. Projection optics can then be used to image the slit onto the film. For this setup, it is desirable to have a relatively low beam divergence to reduce the amount of light incident on the beam stops which form the slit. In addition to being wasted, the light hitting the beam stops can create heating problems.

Excimer gas discharge laser sources are capable of producing the high power pulses suitable for generating a laser crystallization line beam, as described above. For example, relatively high power, excimer laser sources have been used successfully in photolithograpy applications. These excimer laser sources are typically line narrowed and emit a beam having a cross section with a short axis of about 3 mm and a long axis of about 12 mm. Generally, excimer laser sources for lithography employ metastable resonators established by a diffraction grating (in Littrov arrangement) and flat output coupler (i.e., a plano-plano resonator). With this arrangement, a beam with a relatively high divergence is produced.

With the above considerations in mind, applicant discloses devices and methods for creating a low divergence, high power laser beam for material processing applications.

SUMMARY OF THE INVENTION

In a first aspect of an embodiment of the invention, a thin beam laser crystallization apparatus for selectively melting a film deposited on a substrate may comprise a laser source producing a pulsed laser output beam, the source having an oscillator comprising a convex reflector and a plano output coupler; and an optical arrangement focusing the beam in a first axis and spatially expanding the beam in a second axis to produce a line beam for interaction with the film.

For this aspect, the convex reflector may be cylindrical defining a cylinder axis, and may be positioned with the cylinder axis parallel to a first beam dimension, with the optical arrangement focusing the first beam dimension in the first axis. In one embodiment, the laser source may further comprise an amplifier, and in a particular embodiment the laser source may further comprise an optic, e.g., lens, converging an output beam from the oscillator for input into the amplifier. A polarizer may be interposed between the reflector and output coupler.

In one arrangement, the apparatus may include a beam mixer and/or a temporal pulse stretcher. The oscillator may be an excimer gas discharge oscillator. In one setup, the convex reflector may be spaced from the plano output coupler by a distance, L, the convex reflector may have a radius of curvature, r, and the ratio r/L may be in the range of 0.5 to 5. In a particular setup, the distance, L may be in the range of 1.0 m to 2.0 m and the radius of curvature, r may be in the range of 2.0 m to 3.0 m.

In another aspect of an embodiment, a thin beam laser crystallization apparatus for selectively melting a film deposited on a substrate may comprise an excimer gas discharge laser source producing a pulsed output beam, the source having an oscillator with a low divergence unstable resonator configuration producing an oscillator output beam having low divergence in a selected beam axis; and an optical arrangement focusing the beam in the selected beam axis and spatially expanding the beam in an axis orthogonal to the selected beam axis to produce a line beam for interaction with the film. In one embodiment, the oscillator may comprise a convex reflector and a piano output coupler, and in a particular embodiment, the convex reflector may be cylindrical defining a cylinder axis, the reflector may be positioned with the cylindrical axis parallel to a first beam dimension, the first beam direction corresponding to the selected beam axis.

For this aspect, the laser source may comprise an amplifier, and in one arrangement, the laser source may comprise a lens operating on an output beam from the oscillator prior to input into the amplifier.

For another aspect of an embodiment, a thin beam laser crystallization apparatus for selectively melting a film deposited on a substrate may comprise a means for producing a pulsed output beam having divergence in a selected beam axis lower than a divergence obtained using a comparable planoplano oscillator; and a means for focusing the beam in the selected beam axis and spatially expanding the beam in an axis orthogonal to the selected beam axis to produce a line beam for interaction with the film. In one implementation, the producing means may comprise a cylindrical convex reflector and a substantially flat output coupler and in a particular implementation, the producing means may comprise an excimer gas discharge laser source having an oscillator and an amplifier. For this aspect, the laser source may further comprise an optic converging an output beam from the oscillator for input into the amplifier.

DETAILED DESCRIPTION OF PREFERRED EMBODIMENTS

Figure 1:
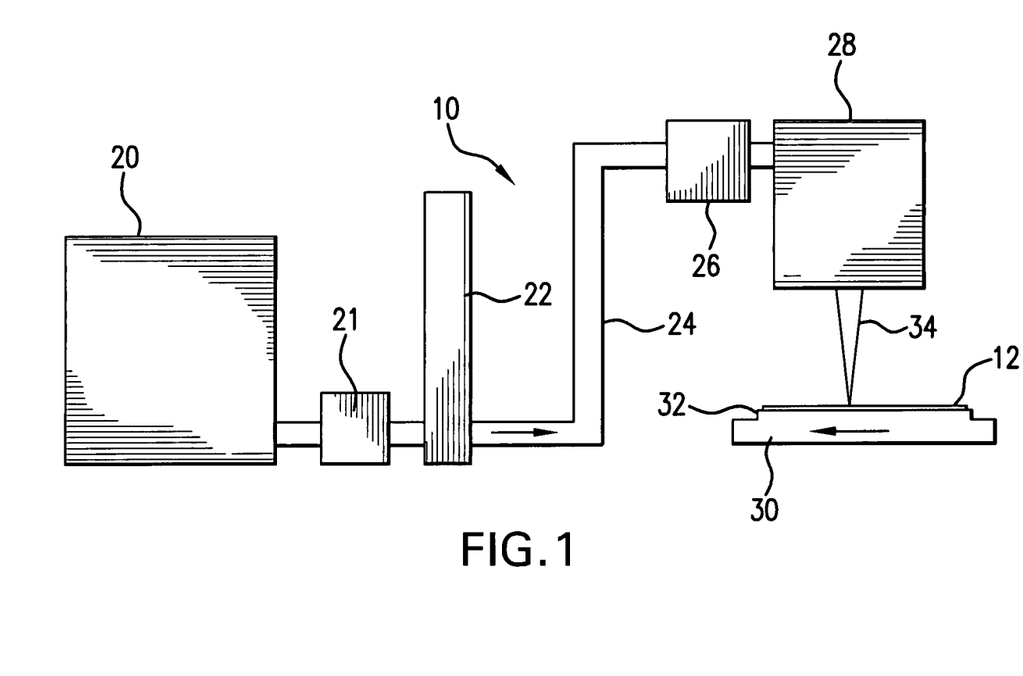
FIG. 1 shows a schematic view of the primary components of an exemplary production system for crystallizing an amorphous silicon film.

Referring initially to FIG. 1, there is shown a schematic, not to scale, view of the primary components of a production system, designated generally system 10, for processing a material with a laser beam, e.g., crystallizing an amorphous silicon film 12. Although the following description will described with reference to silicon film crystallization, it is to be appreciated that the principals will be equally applicable to other applications in-which a laser beam is used to process a material.

As shown in FIG. 1, the system 10 may include a laser source 20 for generating a pulsed laser beam. The system 10 may further include a beam mixer 21 for increasing an intensity symmetry along one or more selected transverse axes of the beam, a pulse stretcher 22 for increasing pulse duration and/or a beam delivery unit 24 which may have a mechanism to actively steer the beam and/or an active beam expander.

More details regarding a beam mixer may be found in co-pending, co-owned U.S. patent application Ser. No. 11/447,380, titled, "DEVICE AND METHOD TO STABILIZE BEAM SHAPE AND SYMMETRY FOR HIGH ENERGY PULSED LASER APPLICATIONS" to Hofmann filed on Jun. 5, 2006, the entire contents of which are hereby incorporated by reference.

More details regarding a pulse stretcher may be found in co-pending, co-owned U.S. Patent Application No. 60/811,242, titled, "HIGH POWER EXCIMER LASER WITH PULSE STRETCHER" to Hofmann et al., filed on Jun. 5, 2006, the entire contents of which are hereby incorporated by reference.

Continuing with FIG. 1, the system 10 may further include a stabilization metrology module 26 for measuring one or more beam characteristics, e.g., wavefront and/or beam pointing and generating control signals for use by the active steering unit and/or the active beam expander. System 10 may also include an optics module 28 for beam homogenization, beam shaping and/or beam focusing, and a moveable stage system 30 for holding and positioning a silicon film 12 that has been deposited on a substrate 32, which can be, for example, glass. A layer of buffer material (not shown) may be interposed between the glass and the silicon layer.

In more detail, the optics module 28 which may include a homogenizing unit, a field definition unit having opposed beam stops which establish a slit-shaped aperture and a short-axis focusing/long-axis expanding optics unit which images the slit-shaped aperture at the film. All of units of the module may be arranged along a common beam path. When used, the homogenizing unit may include one or more optics, e.g., lens arrays, distributed delay devices, etc., for homogenizing the beam in the short-axis and one or more optics, e.g., lens arrays, distributed delay devices, etc., for homogenizing the beam in the long-axis.

More details regarding a beam delivery unit, stabilization metrology module and optics module may be found in copending, co-owned U.S. application Ser. No. 11/138,001, titled "SYSTEMS AND METHODS FOR IMPLEMENTING AN INTERACTION BETWEEN A LASER SHAPED AS A LINE BEAM AND A FILM DEPOSITED ON A SUBSTRATE" filed on May 26, 2005, the entire contents of which are incorporated by reference.

In overview, the system 10 shown in FIG. 1 and described in greater detail below can be configured to generate a focused thin beam 34, e.g., line beam, having a width at the film 12 of about 20 microns or less (short-axis), e.g., 3-4 microns, and a length of 700 mm or more (long-axis) and a depth of focus (DOF) of about +/−30 to 50 microns. Each pulse of the focused thin beam can be used to melt a strip of amorphous silicon, and after the end of the pulse, the molten strip crystallizes. In particular, the molten strip crystallizes in a lateral growth process in which grains grow in a direction parallel to the short-axis. Grains grow inward (parallel to the short-axis) from both edges and meet, creating a ridge (a so-called grain boundary protrusion) along the center of the strip which extends out of the plane of the silicon film. The stage is then moved, either incrementally or continuously, to expose a second strip that is parallel to and overlaps a portion of the first strip. During exposure, the second strip melts and subsequently crystallizes. An overlap sufficient to re-melt the ridge may be used. By re-melting the ridge, a relatively flat film surface (e.g., peak-to-peak value of ~15 nm) may be maintained. This process, which is hereinafter referred to as thin beam directional crystallization (TDX) is typically repeated until the entire film is crystallized.

Figure 2:
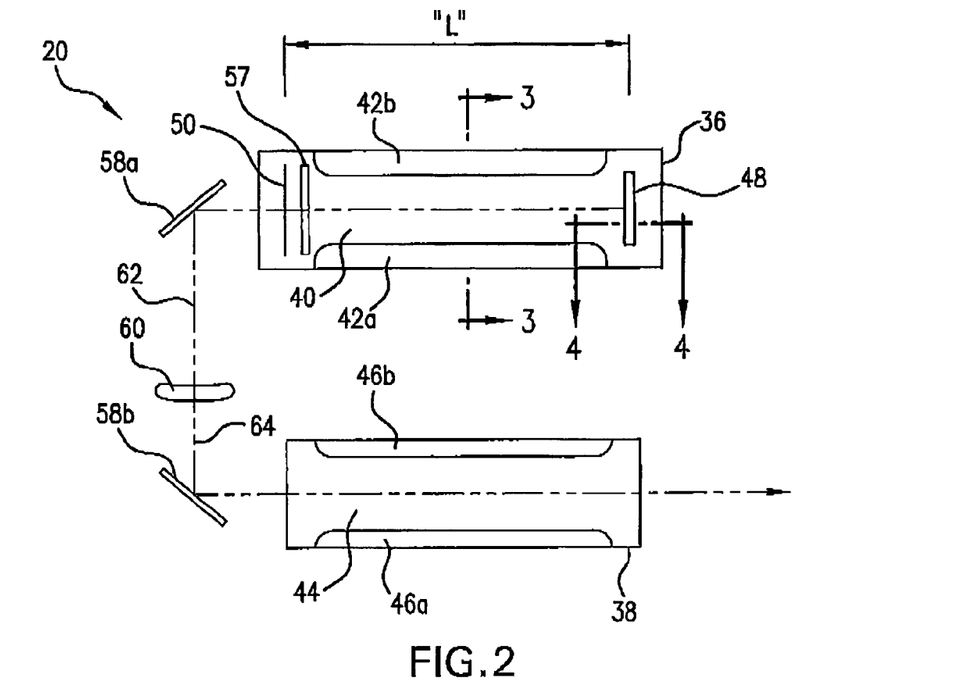
FIG. 2 shows a schematic view of a two chamber laser source.

As shown in FIG. 2, the laser source 20 may be a two chamber system having an oscillator 36, e.g., power oscillator and an amplifier 38, e.g., power amplifier, and accordingly, may be referred to as a so-called POPA laser source. In one implementation of the crystallization process described above, a 6 Khz (6000 pulses per second) POPA laser may be used with pulse energies of approximately 150 mJ-225 mJ. Although a single pass amplifier 38 is shown, it is to be appreciated that, depending on the application, a multiple pass amplifier or in some cases a ring amplifier may be used. FIG. 2 illustrates that the oscillator 36 may form a discharge chamber 40 which may contain two elongated electrodes 42a,b, and a suitable laser gas, e.g., XeCl, XeF, etc. Similarly, the amplifier 38 may form a discharge chamber 44 which may contain two elongated electrodes 46a,b, and a suitable laser gas, e.g., XeCl, XeF, etc. The chambers 40, 44 may also include a high voltage source (not shown) to create an electric discharge between the electrodes, a preionizer system (not shown), a tangential fan (not shown) for circulating the laser gas between the electrodes, one or more water-cooled finned heat exchangers (not shown), metrology equipment (not shown) to measure various pulse parameters, e.g., pulse energy, and a control system (not shown).

FIG. 2 further shows that the oscillator 36 may include a convex reflector 48 and a plano output coupler 50. For example, the convex reflector may be cylindrical defining a cylinder axis 52 (see FIGS. 3 and 4) such as a UV grade fused silica reflector having a convex surface radius of curvature of 3.00+/−0.03 m (e.g., for use in a cavity having length, L of about 1.5 m) and having a excimer grade reflective coating on the surface with reflectivity greater than 99% at a zero degree angle of incidence. For the piano output coupler 50, a UV grade fused silica coupler with wedge less than 5 arc minute, coated on one side with a UV grade anti-reflective coating and on the other with a UV grade reflective coating with reflectivity of about 30%+/−4% at a zero degree angle of incidence may be used. Alternatively, the reflector 48 may be convex in more than one axis, e.g., having a spherical or aspheric surface.

With the arrangement shown in FIG. 2, the oscillator 36 may have a low divergence unstable resonator configuration producing an oscillator output beam having low divergence in one or more transverse beam axes. In particular, the oscillator 36 shown may have a divergence in one or more selected beam axes that is lower, in some cases appreciable lower, than the divergence obtained using a comparable plano-plano oscillator (not shown).

Figure 3:
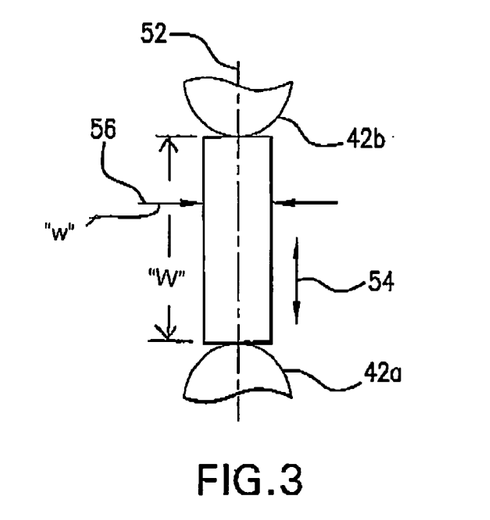
FIG. 3 shows a schematic, sectional view as seen along line 3-3 in FIG. 2.
Figure 4:
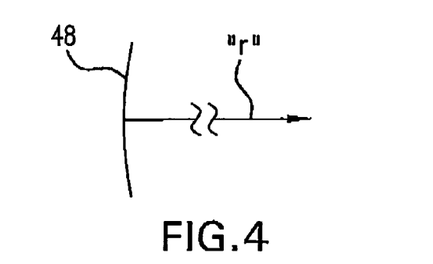
FIG. 4 shows a schematic, sectional view as seen along line 4-4 in FIG. 2.

FIGS. 3 and 4 illustrate the beam axis for an oscillator having a cylindrical convex reflector 48. As shown, the cylinder may be aligned with its axis 52 parallel to the direction 54 corresponding to a path from one electrode 42a to 42b. This structure results in a beam with low divergence in the short axis 56. This short axis 56 of the beam can then be optically manipulated to create the short axis of the line beam 34 (FIG. 1).

FIG. 2 shows that the apex of the convex reflector 48 may be spaced from the piano output coupler by the distance, L. Also, as seen in FIG. 4, the convex reflector 48 may have a radius of curvature, r. For the oscillator 36 and the ratio r/L may be in the range of about 0.5 to 5. In a typical setup, the distance, L may be in the range of about 1.0 m to 2.0 m and the radius of curvature, r may be in the range of about 2.0 m to 3.0 m.

A polarizer 57 may be interposed between the reflector and output coupler e.g., establishing a beam having primarily s-polarization to, among other things, increase reflectivity at reflective optics such as turning mirrors 58a,b. For example, the polarizer may be a flat, $CaF_2$, 40 mm OD, 7 mm thick, clocked, aligned at the proper angle and mounted.

FIG. 2 further shows that the laser source may include an optic 60, e.g., one or more lenses, mirrors, prisms, wedges, etc, converging an output beam 62 from the oscillator 36 to create a converging input beam 64 directed toward the amplifier. For example, the optic 60 may be used to improve laser efficiency. In one implementation, an f=4.3 m spherical lens was positioned between the oscillator 36 and amplifier 38. In some cases, a cylindrical lens, e.g. f=1.65 m may be used for the optic 60. The lens to system aperture distance may be about 2.0 m and the distance of lens to center of the amplifier 38 may be about 1.2 m. The purpose of the optic 60 is to funnel more of the oscillator 36 energy through the amplifier 38 and thereby increase total laser energy. The focal length was chosen such that the long-axis beam waist divergence×focal length remains similar to the open aperture (electrode gap) of the oscillator 36 and amplifier 38 chambers. This means, the lens is not actually focusing the beam, but rather contains it. The optic 60 can also serve to reduce the short axis wavefront curvature and makes the output more collimated. Use of the optic is particularly useful when the oscillator 36 and amplifier 38 have the same electrode spacing. For this case, the absence of an optic 60 may cause a diverging beam from the oscillator 36 to overfill the amplifier 38 and waste power. Use of a system where the oscillator 36 and amplifier 38 have the same electrode spacing may allow both chambers to use the same discharge voltage, simplifying timing and control of the laser source 20.

Other Unstable Resonator Configurations

In some applications, e.g., the generation of a line beam having a relatively small width of about 20 microns or less, e.g., 3-4 microns, and a relatively long beam length of about 700 mm, or larger, e.g., 900 mm, it may be desirable to produce a laser output beam having a relatively low divergence in a first axis, e.g., a divergence less than about three times diffraction limited for the beam's dimension along the first axis. This may allow the beam to be focused tightly, e.g. to 3-4 microns, in the first axis. It may also be desirable for the laser output beam to have a relatively high divergence in a second axis, orthogonal to the first axis, e.g., a divergence greater than about three times diffraction limited for the beam's dimension along the second axis (where focusing may not be required) to reduce the beam's coherence and associated speckle.

In excimer lasers and some other laser types, a nearly stable cavity, e.g., formed by a flat output coupler and oppose mirror or grating, may be used since the number of light round-trips required in an excimer laser cavity is generally small. On the other hand, stable cavities tend to work better in low-gain, long duration lasers. Thus, an unstable resonator having cylindrical components which simulate a nearly stable flat/flat cavity in a first axis and an unstable resonator in a second axis orthogonal to the first axis, may be used with excimer gain media to produce an output beam having a relatively high divergence and low coherence in one axis and relatively low divergence in the other.

FIGS. 2-4 (previously described), 5-11 and 11A illustrate unstable resonator cavities which may be employed to produce a beam having relatively low divergence in a first axis and relatively high divergence in a second axis, orthogonal to the first axis. Each cavity shown includes a reflective mirror and an opposed output coupler. In general, unstable resonator cavities are described in the textbook "Lasers" (published by University Science Books, Mill Valley, Calif., 1986) by Siegman, see e.g., chapters 22 and 23. For the case where light is coupled out of the laser cavity around the edge of the output coupler it is often referred to as an edge-coupled unstable resonator. On the other hand, the output beam may be coupled through a partially reflective output coupler. These arrangements are often referred to as a "continuously-coupled unstable resonator". In some cases, light is coupled through a coating whose reflectivity varies with position across the output coupler, which is sometimes referred to as a "variable reflectivity output mirror" or VRM. In addition, unstable resonators can be classified as positive branch unstable resonator if the ray position on each pass remains on a same side of the resonator ray axis or a negative branch unstable resonator if the ray position on each pass oscillates back and forth across the resonator ray axis on each pass.

As used herein, the term "confocal unstable resonator" and its derivatives means that the two curved mirrors forming the resonator are positioned so that their focal points for parallel incident light are at the same point.

Figure 5:
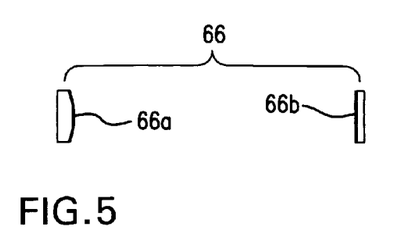
FIGS. 5-11 and 11A show several unstable resonator configurations.

Referring now to FIG. 5, a continuously-coupled, unstable resonator configuration 66 having a convex, partially reflective output coupler 66a and opposed, substantially flat fully reflective mirror 66b is shown.

Figure 6:
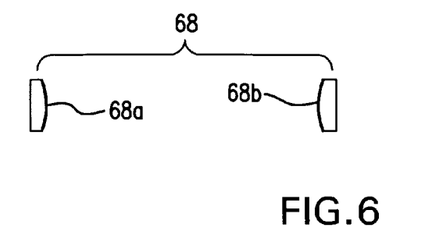

FIG. 6 shows a continuously-coupled unstable resonator configuration 68 having a convex, partially reflective output coupler 68a and opposed, convex fully reflective mirror 68b.

Figure 7:
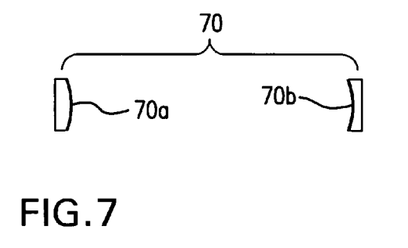

FIG. 7 shows a continuously-coupled, confocal unstable resonator configuration 70 having a convex, partially reflective output coupler 70a and opposed, concave fully reflective mirror 70b.

Figure 8:
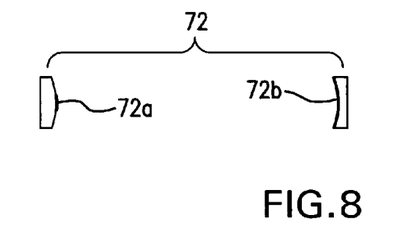

FIG. 8 shows an edge coupled, confocal unstable resonator configuration 72 having a convex, fully reflective output coupler 72a and opposed, concave fully reflective mirror 72b.

Figure 9:
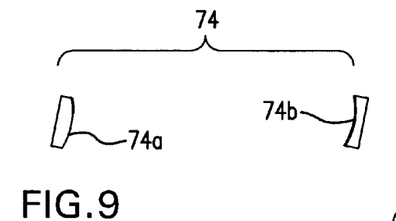

FIG. 9 shows an edge coupled, off-axis confocal unstable resonator configuration 74 having an off-axis convex, fully reflective output coupler 74a and opposed, off-axis concave fully reflective mirror 74b.

Figure 10:
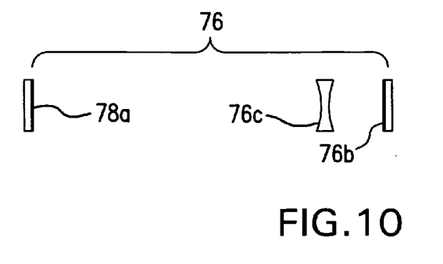

FIG. 10 illustrates that for each of the unstable resonator cavities previously described (i.e., FIGS. 2-4 and 5-11), an equivalent cavity (designated 76) may be constructed using an intra-cavity lens 76c disposed between an output coupler 76a and fully reflective mirror 76b.

Figure 11:
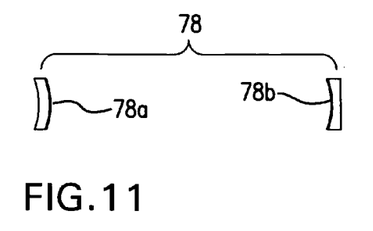

FIG. 11 illustrates that for each of the unstable resonator cavities previously described (i.e., FIGS. 2-4 and 5-11), a cavity (designated 78) producing a collimated output may be constructed using an output coupler 78a having a curved backside and fully reflective mirror 78b.

Figure 11A:
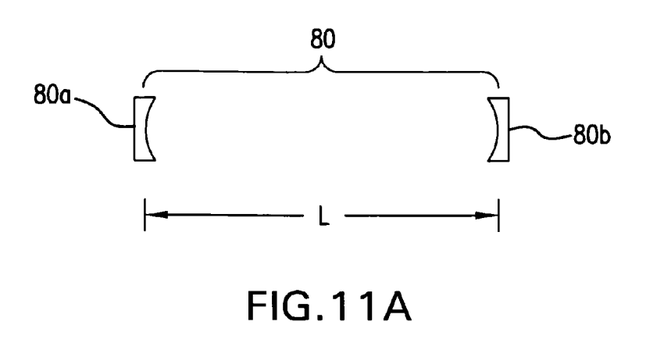

FIG. 11A shows an edge coupled, unstable resonator configuration 80 having a concave, fully reflective output coupler 80a of radius $R_1$ and opposed, concave fully reflective mirror 80b of radius $R_2$. This arrangement may be constructed as confocal, concentric, off-axis, etc. and may be unstable for $g_1 g_2 < 0$ or $g_1 g_2 > 1$ where $g_1 = 1 - (L/R_1)$ and $g_2 = 1 - (L/R_2)$.

Figure 12:
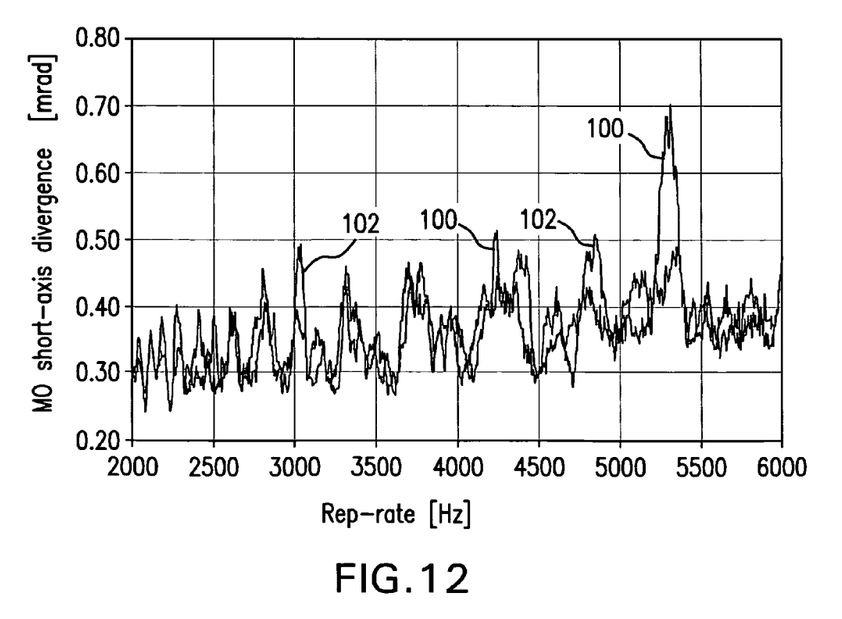
FIG. 12 shows plots of measured divergence as a function of pulse repetition rate for the same chamber, but at two different times in the chamber's life.

FIG. 12 is a flow chart illustrating a method for producing a beam having a selected divergence in at least one axis using a pulsed laser.

Figure 13:
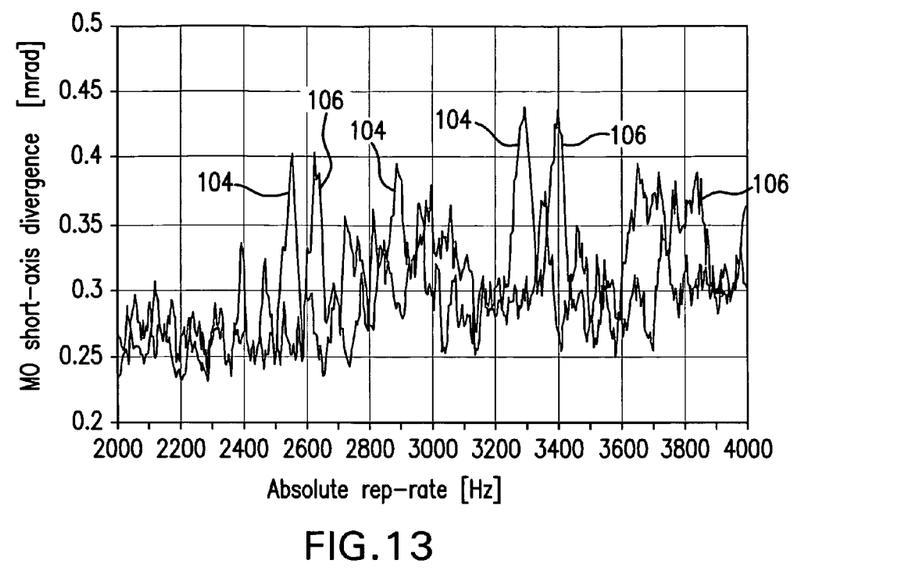
FIG. 13 shows measured divergence as a function of pulse repetition rate for the same chamber at two different chamber operating temperatures.
Figure 14:
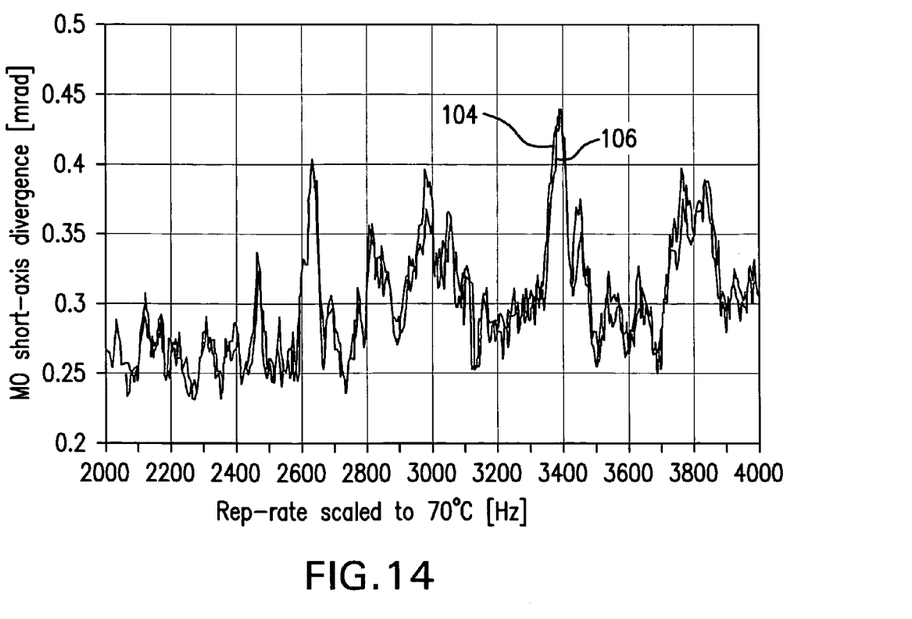
FIG. 14 which shows the two plots of FIG. 13 after the frequency axis was corrected according to the square root of the gas temperature.
Figure 15:
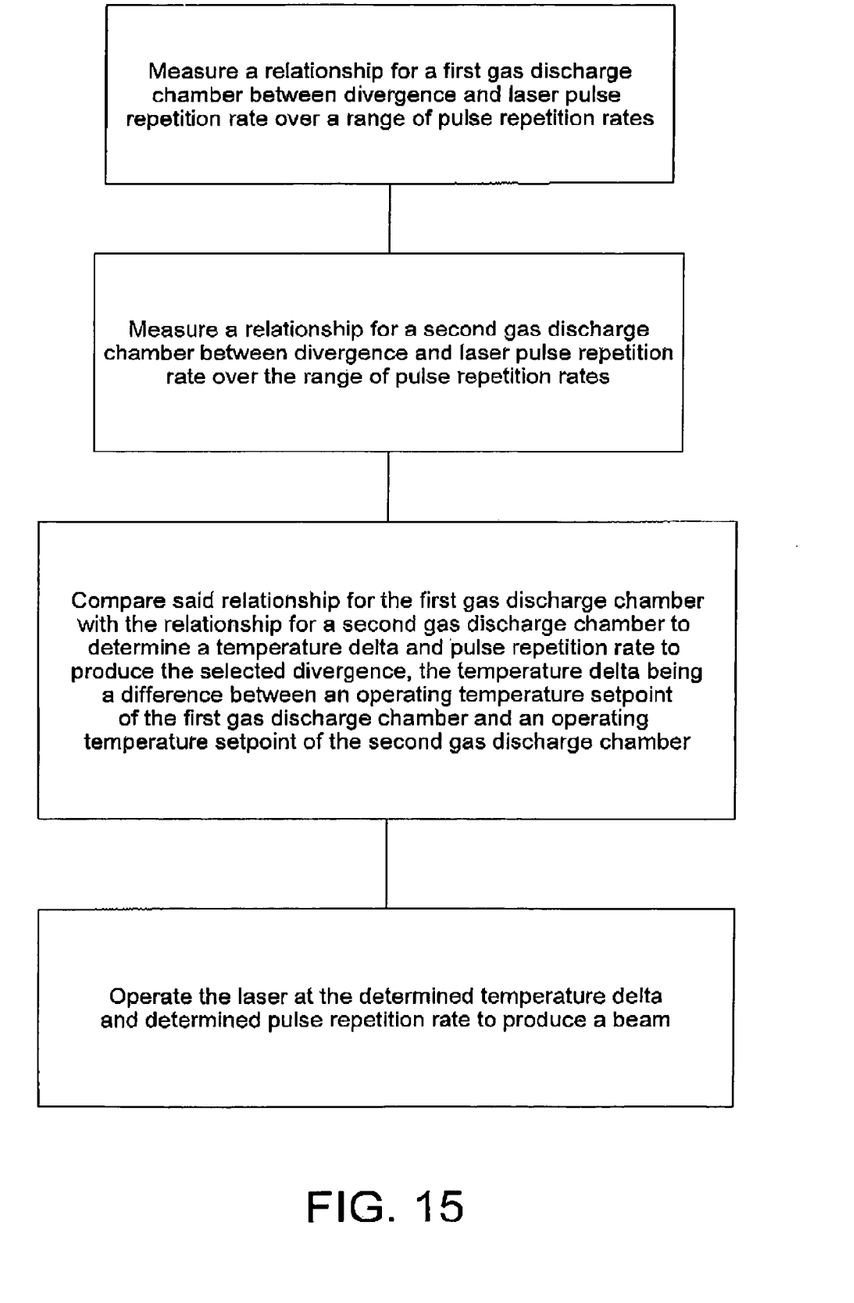
FIG. 15 is a flow chart illustrating a method for producing a beam having a selected divergence in at least one axis using a pulsed laser.

Operation of Chambers at Different Temperatures to Align their Resonance Spectra and Thereby Decrease Divergence Applicant has found that when two laser chambers and designed and manufactured to be identical, small variations between the two chambers may still exist and, as a consequence, the chambers may produce differing acoustic reflections during pulse discharge. This difference may arise due to manufacturing defects/irregularities and, for example may arise when one chamber has been operated significantly longer than the other. For example, FIG. 12 shows plots of measured divergence as a function of pulse repetition rate for the same chamber, but at two different times in the chamber's life (plot 100 shows the relationship after a billion pulses and plot 102 shows the relationship after about six billion pulses). The result of this is that for any two chambers in a multi-stage laser, the variation of an output beam property (such as divergence) with pulse repetition rate (rep. rate) may be different for the two chambers. Thus, selecting a pulse repetition rate which minimizes divergence in one chamber may not necessarily minimize divergence in another "identical" chamber, e.g. in a multi-stage laser, e.g. MOPA, both chambers may affect divergence. However, Applicant has also determined that by changing the chamber operating temperature, e.g., gas temperature, the divergence-rep. rate variation may be shifted relative to the rep. rate. For example, FIG. 13 shows measured divergence as a function of pulse repetition rate for the same chamber at two different chamber operating temperatures with plot 104 showing the relationship for the chamber operating at a temperature of about 50 degrees Celsuis and plot 106 showing the relationship for the chamber operating at a temperature of about 50 degrees Celsuis. It can be seen that plot 104 has a shape similar to plot 106 but is shifted along the absolute rep rate axis by about 100 Hz. This is further clarified in FIG. 14 which shows the two plots 104, 106 after the frequency axis was corrected according to the square root of the gas temperature.

With the above in mind, the following steps/acts may be performed to produce a beam having a selected divergence, e.g., a minimum divergence, in at least one beam axis using a pulsed, multi-stage laser, e.g., having two or more chambers. First, a relationship between divergence and laser pulse repetition rate over a desired range of pulse repetition rates may be measured for each chamber. Next, the measured relationships may be compared to determine suitable operating temperatures for each stage, e.g., control setpoints, e.g., gas temperature control setpoints. This determination may be made, for example by a computer processing an algorithm, using a mathematical formula, e.g., the proportionality of frequency shift to the square root of gas temperature. Alternatively, data corresponding to the plots shown in FIG. 13 may be provided in a "lookup table" accessible by a processor, e.g., computer processor, to determine the suitable operating temperatures.

Temperature differences between stages may exceeds 5 degrees C. may exceeds 1 degrees C. and in some cases may exceed 15 degrees C. The above-described process may be repeated at various times over the multi-stage laser's lifetime, or if a chamber is swapped out or serviced, to reset the multi-stage laser to produce a selected divergence.

In a typical excimer laser chamber, gas temperature control may be established and maintained using one or more heat exchangers and one or more heaters. For example, the heat exchangers may include a finned member having cooling channels through which a heat exchange fluid is passed. The finned member is then disposed in the laser gas flow. A valve, responsive to a processor control signal, may be provided to control the rate at which heat exchange fluid passes through the finned member to thereby control chamber temperature. A heater may also be provided, e.g. to heat the chamber during periods of laser downtime. For example, a heating rod, responsive to a processor control signal, may be included to heat the chamber housing.

While the particular aspects of embodiment(s) described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the present invention are merely exemplary, illustrative and representative of the subject matter which is broadly contemplated by the present invention. The scope of the presently described and claimed aspects of embodiments fully encompasses other embodiments which may now be or may become obvious to those skilled in the art based on the teachings of the Specification. The scope of the present invention is solely and completely limited by only the appended Claims and nothing beyond the recitations of the appended Claims. Reference to an element in such Claims in the singular is not intended to mean nor shall it mean in interpreting such Claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present Claims. Any term used in the Specification and/or in the Claims and expressly given a meaning in the Specification and/or Claims in the present Application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this Application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112,sixth paragraph, unless the element is expressly recited using the phrase "means for" or, in the case of a method claim, the element is recited as a "step" instead of an "act".

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended Claims are intended in scope and meaning to cover not only the disclosed aspects of embodiments of the present invention(s) but also such equivalents and other modifications and changes that would be apparent to those skilled in the art.

What is claimed is:

1. A thin beam laser crystallization apparatus for selectively melting a film deposited on a substrate, the apparatus comprising:
    a laser source configured to produce a pulsed laser output beam, the laser source comprising:
        an oscillator configured to form a first discharge chamber comprising an unstable resonator cavity and producing an oscillator output having a beam width, w, in a first axis and a divergence less than three times diffraction limited for the width, w, in the first axis and wherein the oscillator output has a beam width, W, in a second axis and a divergence greater than three times diffraction limited for the width, W, in the second axis; and
        an optical arrangement comprising a convex reflector having a radius of curvature in a range of 2.0 meters to 3.0 meters, and a plano output coupler spaced apart from the convex reflector by a distance in a range of 1.0 meters to 2.0 meters;
    an amplifier configured to form a second discharge chamber;
    measurement equipment configured to measure one or more parameters of the pulsed laser output beam; and
    a control system configured to control the thin beam laser crystallization apparatus,
    wherein a ratio of the curvature of the convex reflector to the spaced apart distance from the convex reflector to the plano output coupler is in the range of 0.5 to 5,
    wherein the optical arrangement is configured to focus the beam in the first axis and spatially expand the beam in the second axis to produce a line beam for interaction with the film,
    wherein the measurement equipment is configured to measure a relationship for a first gas discharge chamber between divergence and laser pulse repetition rate over a range of pulse repetition rates, and a relationship for a second gas discharge chamber between divergence and laser pulse repetition rate over the range of pulse repetition rates, and
    wherein the control unit is configured to compare the measured relationship between divergence and laser pulse repetition rate for the first gas discharge chamber with the measured relationship between divergence and laser pulse repetition rate for the second gas discharge chamber, and adjust at least one of the gas temperature control setpoint and the pulse repetition rate of at least one of the first gas discharge chamber and the second gas discharge chamber to produce the pulsed laser output beam.

2. An apparatus as recited in claim 1 wherein the convex reflector is cylindrical.

3. An apparatus as recited in claim 1 wherein the laser source further comprises a lens operating on an output beam from the oscillator prior to input into the amplifier.

4. A method for producing a beam having a selected divergence in at least one axis using a pulsed laser, said method comprising the acts of:
    measuring a relationship for a first gas discharge chamber between divergence and laser pulse repetition rate over a range of pulse repetition rates;

measuring a relationship for a second gas discharge chamber between divergence and laser pulse repetition rate over the range of pulse repetition rates;

comparing said relationship for the first gas discharge chamber with the relationship for a second gas discharge chamber to determine a temperature delta and pulse repetition rate to produce the selected divergence, the temperature delta being a difference between an operating temperature setpoint of the first gas discharge chamber and an operating temperature setpoint of the second gas discharge chamber; and adjusting at least one of a gas temperature control setpoint and the pulse repetition rate of at least one of the first gas discharge chamber and the second gas discharge chamber to produce a beam having the selected divergence.

5. A method as recited in claim 4 wherein the comparing act determines a temperature delta and pulse repetition rate to produce a minimum divergence within a pulse repetition rate range.

6. A method as recited in claim 4 wherein the determined temperature delta exceeds 5 degrees C.

* * * * *